United States Patent
Chen et al.

(10) Patent No.: US 7,826,553 B2
(45) Date of Patent: *Nov. 2, 2010

(54) MULTILEVEL LINC TRANSMITTER

(75) Inventors: Yuan-Jyue Chen, Taipei (TW);
Kai-Yuan Jheng, Taoyuan County (TW); An-Yeu Wu, Taipei (TW)

(73) Assignees: Mediatek Inc., Hsin-Chu (TW); National Taiwan University, Taipei (TW)

( * ) Notice: Subject to any disclaimer, the term of this patent is extended or adjusted under 35 U.S.C. 154(b) by 710 days.

This patent is subject to a terminal disclaimer.

(21) Appl. No.: 11/755,036

(22) Filed: May 30, 2007

(65) Prior Publication Data

US 2008/0019456 A1    Jan. 24, 2008

Related U.S. Application Data

(60) Provisional application No. 60/807,952, filed on Jul. 21, 2006, provisional application No. 60/909,489, filed on Apr. 2, 2007.

(51) Int. Cl.
*H04K 1/02* (2006.01)
*H04L 25/03* (2006.01)

(52) U.S. Cl. .................. 375/296; 375/264; 375/285; 375/295; 375/297; 455/63.1; 455/114.2; 455/114.3

(58) Field of Classification Search .................. 375/264, 375/296–297, 285; 455/114.3, 63.1, 114.2
See application file for complete search history.

(56) References Cited

U.S. PATENT DOCUMENTS

| | | | | |
|---|---|---|---|---|
| 3,777,275 A | * | 12/1973 | Cox | .............................. 330/10 |
| 3,909,742 A | * | 9/1975 | Cox et al. | ...................... 330/84 |
| 3,927,379 A | * | 12/1975 | Cox et al. | ...................... 330/10 |
| 5,901,346 A | | 5/1999 | Stengel et al. | |
| 6,313,703 B1 | | 11/2001 | Wright | |
| 6,633,200 B2 | * | 10/2003 | Kolanek | ...................... 330/149 |

(Continued)

FOREIGN PATENT DOCUMENTS

| | | |
|---|---|---|
| CN | 1190286 | 8/1998 |
| WO | WO2004077662 | 9/2004 |

OTHER PUBLICATIONS

EU Office Action mailed Oct. 30, 2007.
English abstract of CN1190286, pub. Aug. 12, 1998.

*Primary Examiner*—Mohammad H Ghayour
*Assistant Examiner*—Sophia Vlahos
(74) *Attorney, Agent, or Firm*—Thomas, Kayden, Horstemeyer & Risley

(57) ABSTRACT

A multilevel LINC transmitter. The multilevel LINC transmitter comprises a multilevel signal component separator, a phase modulator block, a mixer block, an up-converter block, a predistorter and an RF block. The multilevel signal component separator comprises a multilevel scaler and converts an input signal to phase signals. The phase modulator block and the predistorter are coupled to the multilevel signal component separator. The mixer block is coupled to the phase modulator block and the predistorter. The up-converter block is coupled to the mixer block. The RF block comprises a plurality of power amplifiers coupled to the up-converter block and a power combiner coupled to the power amplifiers.

12 Claims, 14 Drawing Sheets

U.S. PATENT DOCUMENTS

| | | | |
|---|---|---|---|
| 6,737,914 B2 * | 5/2004 | Gu | 330/2 |
| 6,825,719 B1 * | 11/2004 | Barak et al. | 330/129 |
| 7,260,157 B2 * | 8/2007 | Hagh et al. | 375/297 |
| 7,280,612 B2 * | 10/2007 | Saed | 375/296 |
| 7,336,753 B2 | 2/2008 | Hasson | |
| 7,639,072 B2 | 12/2009 | Sorrells et al. | |
| 2003/0125065 A1 | 7/2003 | Barak et al. | |
| 2004/0185805 A1 | 9/2004 | Kim et al. | |
| 2005/0260956 A1 | 11/2005 | Loraine et al. | |

\* cited by examiner

MULTILEVEL LINC TRANSMITTER

This application claims the benefit of U.S. Provisional Application No. 60/807,952, filed on Jul. 21, 2006 and U.S. Provisional Application No. 60/909,489, filed on Apr. 2, 2007.

BACKGROUND OF THE INVENTION

1. Field of the Invention

The invention relates to a LINC transmitter and, in particular, to a multilevel LINC transmitter.

2. Description of the Related Art

To prolong battery life of mobile handset devices, power efficiency demands from wireless mobile communication systems have become more important. Specifically, a transceiver's most power hungry device is a power amplifier which has nonlinear characteristics. Meanwhile, modulation of non-constant-envelope signals demands high linearity from a power amplifier. As a result, there is a trade off between linearity and power efficiency in a wireless transmitter.

Various PA linearization techniques have been adopted to improve linearity and power efficiency of wireless transmitters. Linear amplification with nonlinear components (LINC) is a transmitter architecture which increases linearity and power efficiency of a wireless transmitter. Due to accurate signal processing and insensitivity to process variations, a digital LINC architecture is more suitable for modern process technologies.

FIG. 1 is a block diagram of a conventional LINC architecture. Referring to FIG. 1, an input signal S(t) of the LINC 100 is a varying envelope signal. A signal separator 110 receives and divides the input signal S(t) into two constant-envelope signals S1 and S2. Subsequently, two power amplifiers PA1 and PA2 amplify the constant-envelope signals S1 and S2, respectively. Since a nonlinear power amplifier can amplify a constant-envelope signal linearly, two power efficient nonlinear power amplifiers are used in such architecture. Finally, the two amplified signals are combined by a power combiner 120. Thus, a linearly amplified signal is obtained at an output of the power combiner 120.

The input of the LINC system is a varying-envelope signal S(t), $$S(t) = A(t) \cdot e^{j\phi(t)}$$

wherein A(t) denotes the signal envelope and $\phi(t)$ is the signal phase. In the phasor diagram shown in FIG. 2A, the varying-envelope signal S(t) is split into a set of constant-envelope signals, $S_1(t)$ and $S_2(t)$, $$S(t) = \frac{1}{2}[S_1(t) + S_2(t)]$$
$$= \frac{1}{2}r_0[e^{j(\phi(t)+\theta(t))} + e^{j(\phi(t)-\theta(t))}]$$

And an out-phasing angle $\theta(t)$ is expressed as $$\theta(t) = \cos^{-1}\left(\frac{A(t)}{r_0}\right)$$

Both $S_1(t)$ and $S_2(t)$ are on a circle with a radius $r_0$. In a conventional LINC transmitter, $r_0$ is a constant scale factor predefined by a system designer. Because input range of an inverse cosine function is [−1, 1], selection of $r_0$ is required to satisfy the formula:

$$r_0 \geq \max(A(t))$$

FIG. 2B illustrates the signals after amplification. The amplified signals are expressed as $G \cdot S_1(t)$ and $G \cdot S_2(t)$, where G is voltage gain of the power amplifiers. The two amplified signals are combined by a power combiner to obtain a signal $\sqrt{2}G \cdot S(t)$ which is a linear amplification of the input signal S(t). Because of the out-phasing technique, LINC achieves linear amplification with two power efficient nonlinear power amplifiers.

BRIEF SUMMARY OF THE INVENTION

An embodiment of a multilevel LINC transmitter comprises a multilevel signal component separator, a phase modulator block, a mixer block, an up-converter block, a predistorter and an RF block. The multilevel signal component separator comprises a multilevel scaler and converts an input signal to phase signals. The phase modulator block and the predistorter are coupled to the multilevel signal component separator. The mixer block is coupled to the phase modulator block and the predistorter. The up-converter block is coupled to the mixer block. The RF block comprises a plurality of power amplifiers coupled to the up-converter block and a power combiner coupled to the power amplifiers.

An embodiment of a multilevel LINC transmitter comprises a multilevel signal component separator, a predistorter, a polar to IQ converter block, an up-converter block and an RF block. The multilevel signal component separator comprises a multilevel scaler and converts an input signal to phase signals. The predistorter coupled to the multilevel signal component separator. The polar to IQ converter block coupled to the multilevel signal component separator and the predistorter. The up-converter block coupled to the polar to IQ converter block. The RF block comprises a plurality of power amplifiers coupled to the up-converter block and a power combiner coupled to the power amplifiers.

The invention provides a multilevel LINC transmitter with a multilevel scaler in a multilevel signal component separator thereof. The multilevel scaler dynamically adapts a scale factor according to the input signal and therefore the out-phasing angle is adjustable. As a result, high power efficiency and linearity are achieved.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
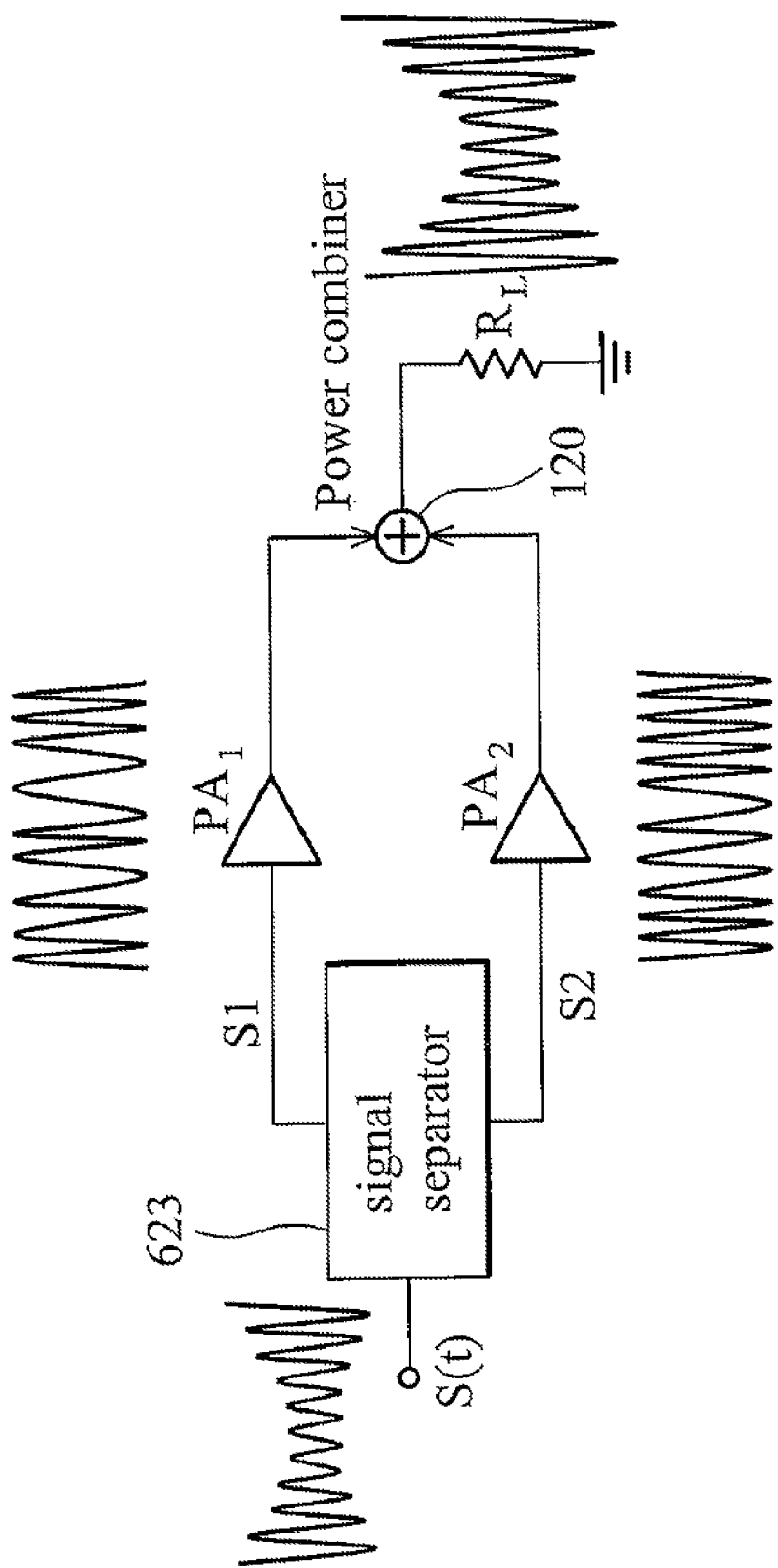
FIG. 1 is a block diagram of a conventional LINC architecture.
Figure 2A:
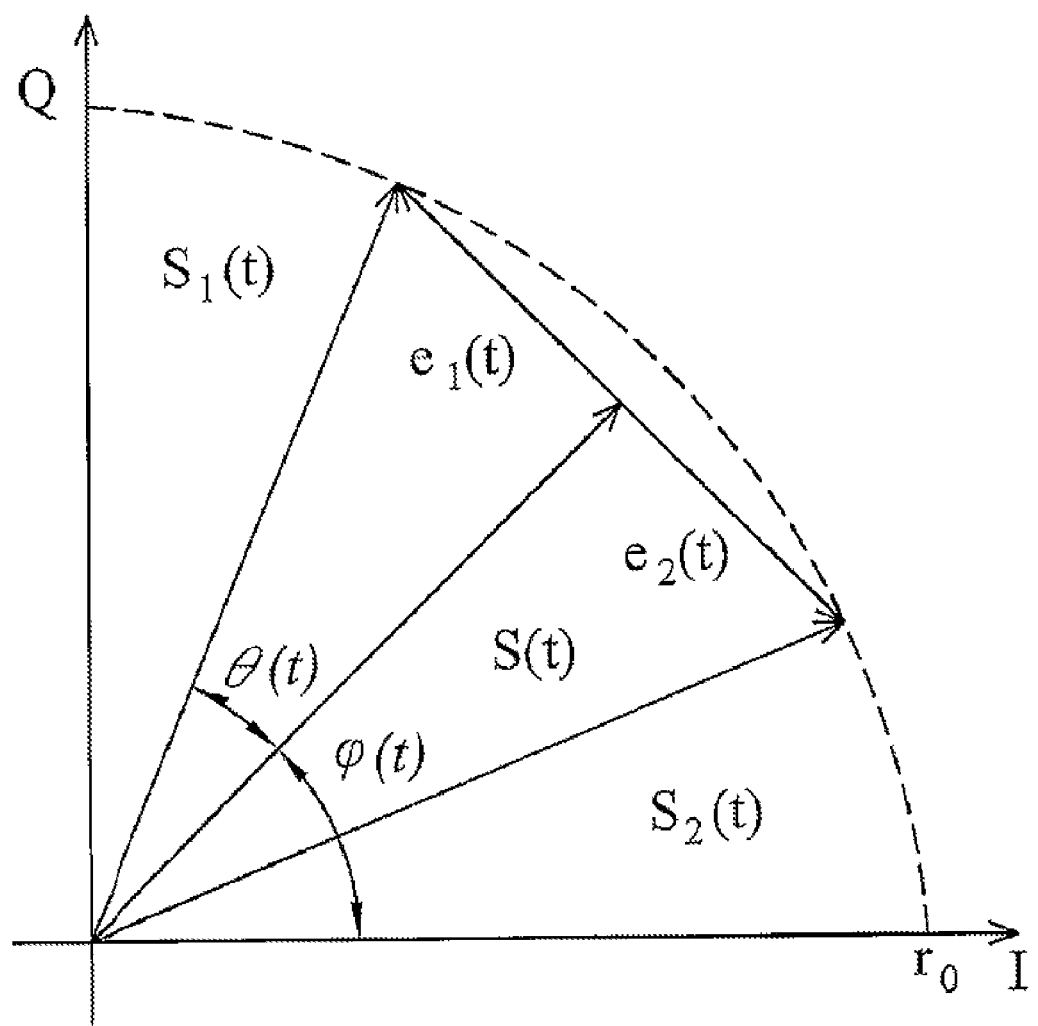
FIGS. 2A and 2B are phasor diagrams, respectively of a signal and components thereof before and after amplification.
Figure 2B:
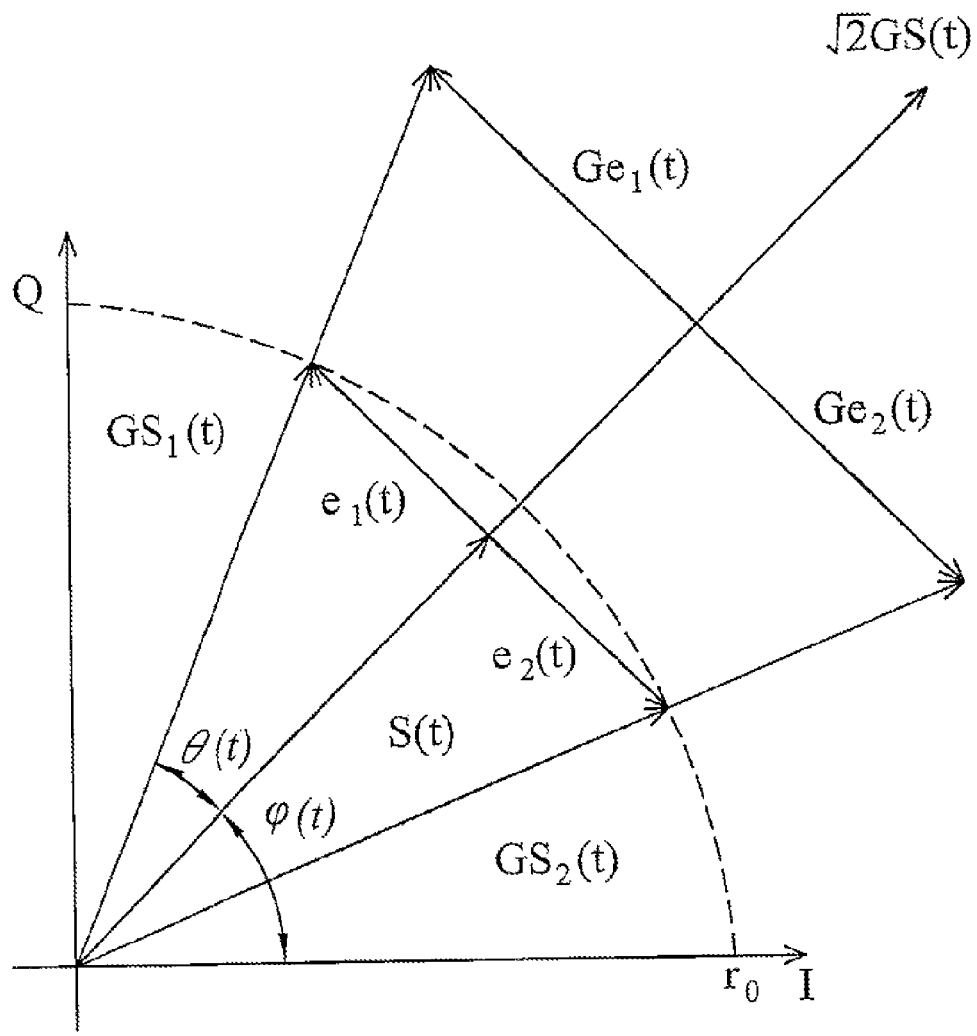
Figure 3:
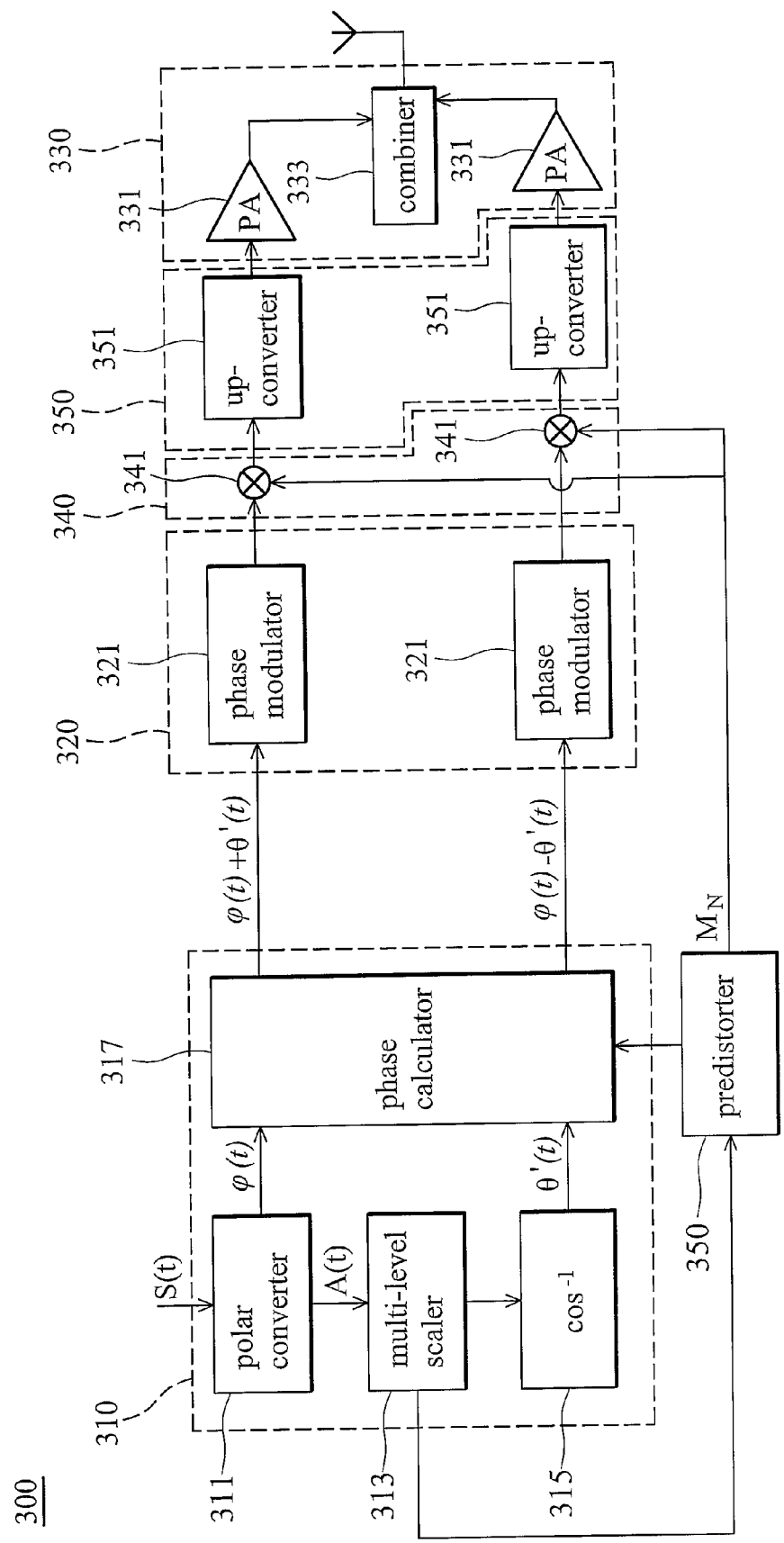
FIG. 3 is a block diagram of a multilevel LINC transmitter according to an embodiment of the invention.

Referring to FIG. 3, the multilevel LINC transmitter 300 comprises a multilevel signal component separator 310, a phase modulator block 320, a mixer block 340, an up-converter block 350, a predistorter 360 and an RF block 330. The multilevel signal component separator 310 comprises a polar converter 311, a multilevel scaler 313 coupled to the polar converter 311, an inverse cosine module 315 coupled to the multilevel scaler 313, and a phase calculator 317 coupled to the polar converter 311 and the inverse cosine module 315. The polar converter 311 receives and converts the input signal S(t) to polar form. Then, an envelope signal A(t) is scaled by a multilevel scaler 313 and the inverse cosine module 315 generates an out-phasing angle θ'(t). Thereafter, the phase calculator 317 generates phase signals φ(t)+θ'(t) and φ(t)−θ'(t). Specifically, the multilevel signal component separator 310 converts the input signal S(t) into phase signals φ(t)+θ'(t) and φ(t)−θ'(t). The phase modulator block 320 comprises two phase modulators 321 coupled to the multilevel signal component separator 310. The predistorter 360 is coupled to the multilevel scaler 313 and the phase calculator 317. The mixer block 340 comprises two mixers 341 coupled to the corresponding phase modulator 321 and the predistorter 360, respectively. The up-converter block 350 comprises two modulators 351 coupled to the corresponding mixers 341, respectively. The RF block 330 comprises a plurality of power amplifiers 331 coupled to the up-converter block 350 and a power combiner 333 coupled to the power amplifiers 331.

In an embodiment of the invention, a Wilkinson power combiner is adopted in a LINC transmitter, however, scope of the invention is not limited thereto. Other hybrid couplers, lossless Wilkinson power combiner, Chireix-outphasing combiner, or the like are also applicable to the invention. For a Wilkinson power combiner, efficiency η(t) thereof is defined as, $$\eta(t) = \cos^2\theta(t)$$

It is noted that η(t) is high when θ(t) is low. When the out-phasing angle θ(t) is substituted by the formula disclosed previously, the efficiency η(t) is expressed as, $$\theta(t) = \cos^{-1}\left(\frac{A(t)}{r_0}\right)$$

As a result, to utilize high power efficiency of a Wilkinson power combiner, the value of $r_0$ must be close to and not less than the maximum of A(t).

Figure 4A:
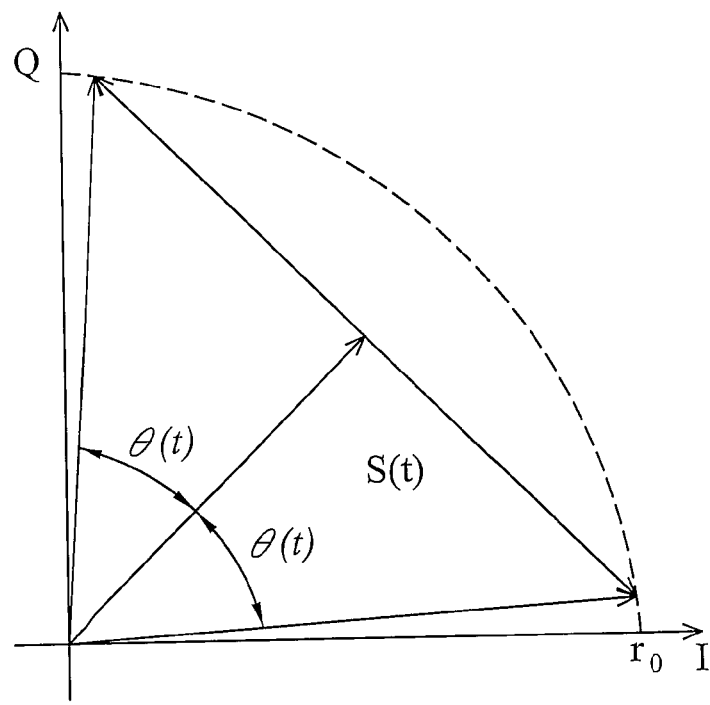
FIGS. 4A and 4B are phasor diagrams, respectively showing out-phasing angles of single-level and multilevel scaling techniques.
Figure 4B:
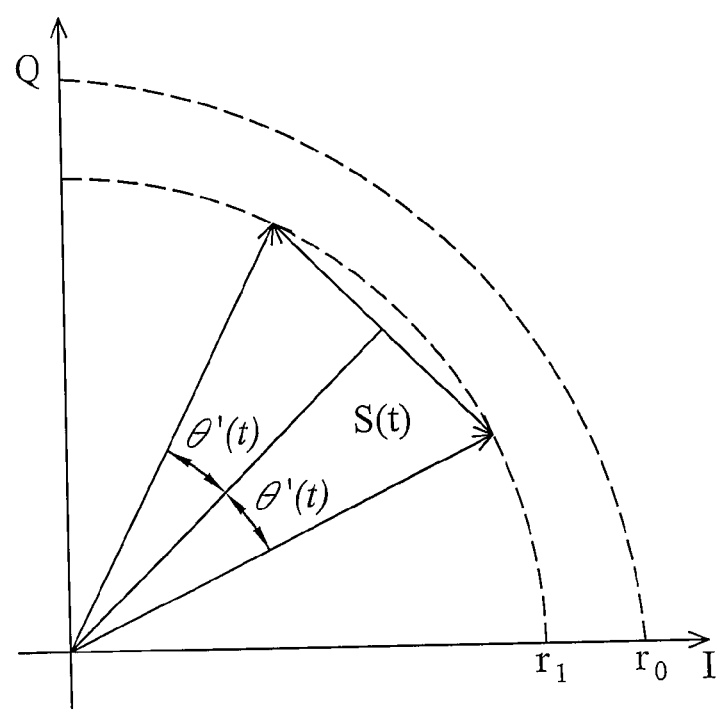
Figure 5A:
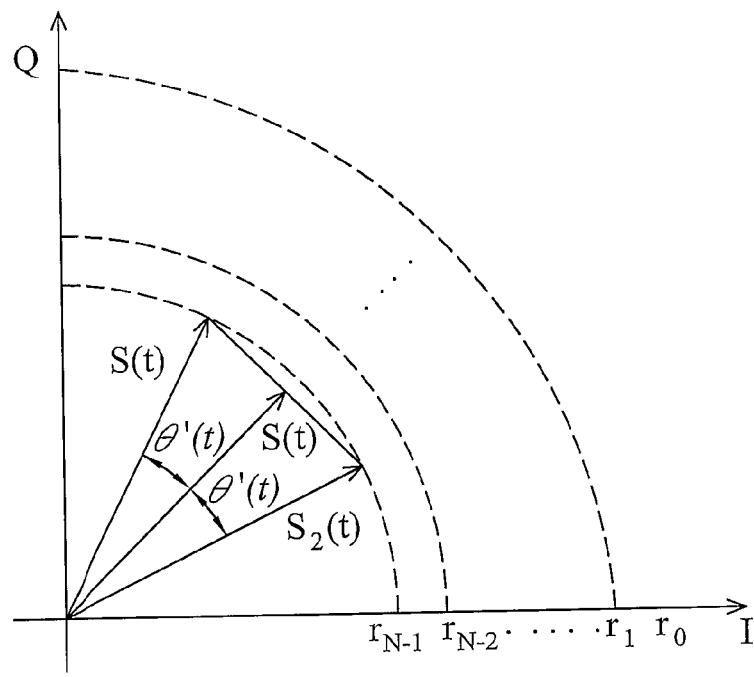
FIGS. 5A and 5B are a detailed phasor diagram and a generalized phasor diagram, respectively showing out-phasing angles of multilevel scaling techniques.
Figure 5B:
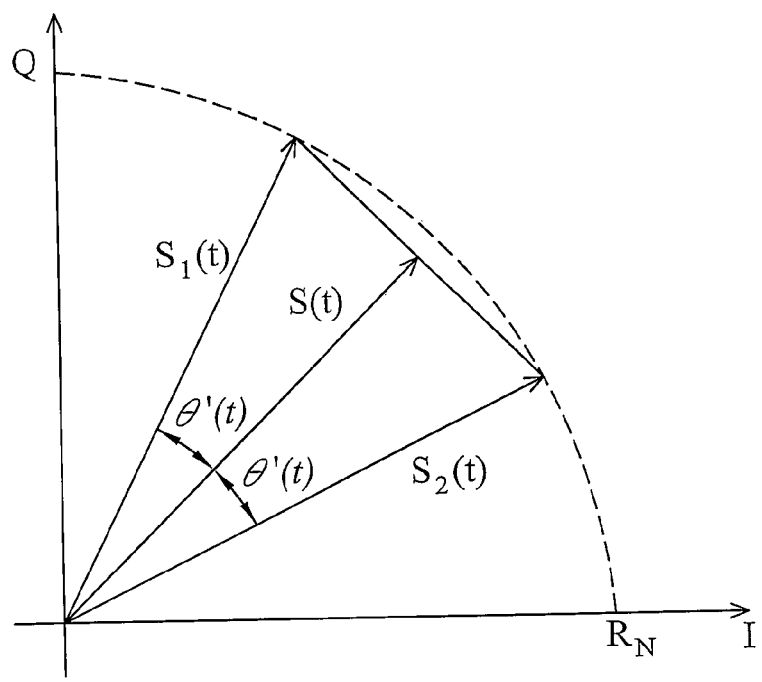

Referring to FIG. 3, rather than the conventional scaling technique using single-level $r_0$, the multilevel scaler 313 reduces θ(t) such that high Wilkinson power combiner efficiency is achieved. Referring to FIG. 4B, a 2-level design example is illustrated. In the embodiment, when A(t) is much smaller than $r_0$, the multilevel scaler adapts scale factor from $r_0$ to $r_1$, and out-phasing angle. θ'(t) in FIG. 4B is much smaller than the conventional out-phasing angle θ(t) in FIG. 4A. Thus, allowing the multilevel scaling technique to enhance Wilkinson combiner efficiency. The multilevel scaling technique can be generalized to N levels in FIG. 5A, and $R_N$ is a general expression for the multilevel as shown in FIG. 5B, where $R_N=r_k$, for $r_{k+1}<A(t)\leq r_k$ k=0,1, ..., N−1, where $r_N=0$, $r_0=\max(A(t))$. The definition of out-phasing angle θ'(t) in multilevel scaling technique is modified as $$\theta'(t) = \cos^{-1}\left(\frac{A(t)}{R_N}\right).$$

To maximize the Wilkinson power combiner efficiency, optimal scale factors of each level $r_k$ need to be determined in advance. Since multilevel scale factors are used in the LINC transmitter, Wilkinson power combiner efficiency formula is modified $$\text{as } \eta(t) = \left(\frac{A(t)}{R_N}\right)^2.$$

Figure 6:
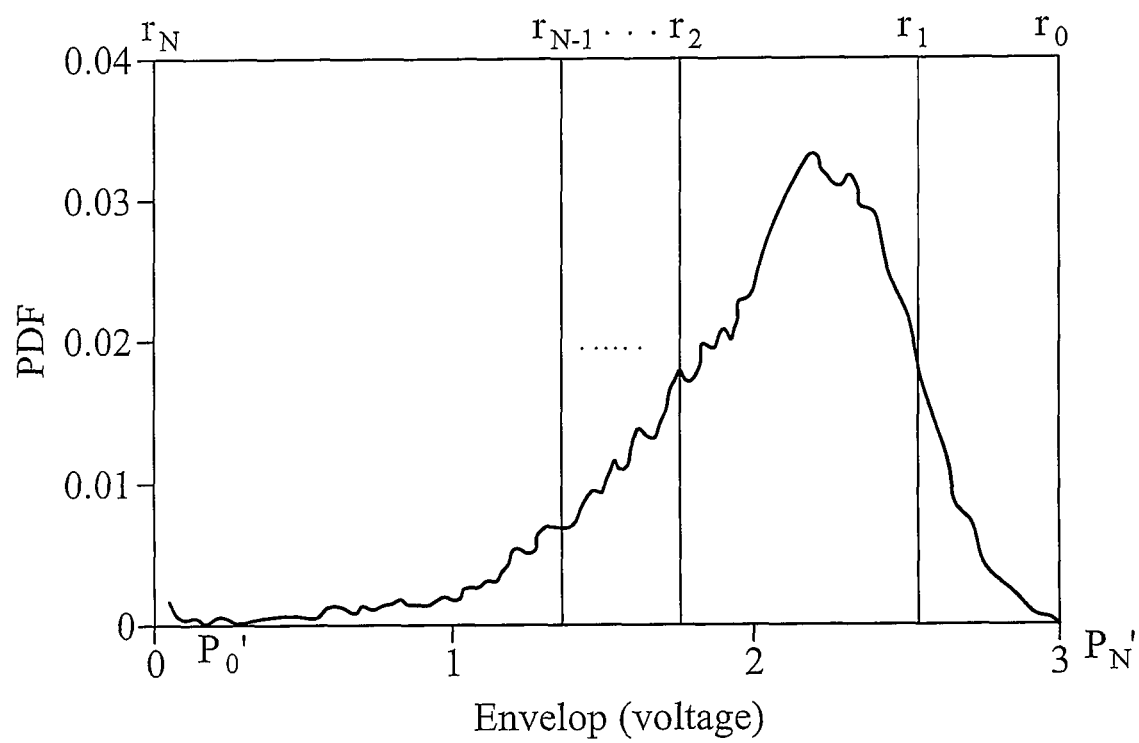
FIG. 6 is a schematic diagram showing signal envelope distribution in WCDMA.

FIG. 6 shows envelope distribution of WCDMA where A(t) is a probability function. To acquire an expected value of η(t), the envelope A(t) is divided into several regions, illustrated in FIG. 5. Then, the expectation value of each region is summed to derive E(η(t)), $$E(\eta(t)) = \sum_{k=0}^{k=N-1} \int_{r_k}^{r_{k+1}} p(A(t)) \cdot \left(\frac{A(t)}{r_k}\right)^2 dA(t),$$

wherein p(A(t)) is a probability density function of A(t), $r_k$ is a value of a kth level scale factor, N is a number of a scale factor level, and max(A(t)) is a maximum input signal envelope. To maximize the Wilkinson power combiner efficiency, E(η(t)) is differentiated such that $$\frac{\partial E(\eta(t))}{\partial R_N} = 0,$$

wherein k=0, 1, ..., N. As a result, an optimal set of $R_N$ is obtained. With the optimal set of $R_N$, the multilevel scaler dynamically adapts $R_N$ close to and no lower than the envelope A(t).

When multilevel scaling techniques are used to increase the combiner efficiency, the input signal is divided into two separated signals containing multilevel envelope $R_N$, expressed as $$S(t) = \frac{1}{2}R_N\{e^{j\cdot(\varphi(t)+\theta(t))} + e^{j\cdot(\varphi(t)-\theta(t))}\}.$$

Figure 7A:
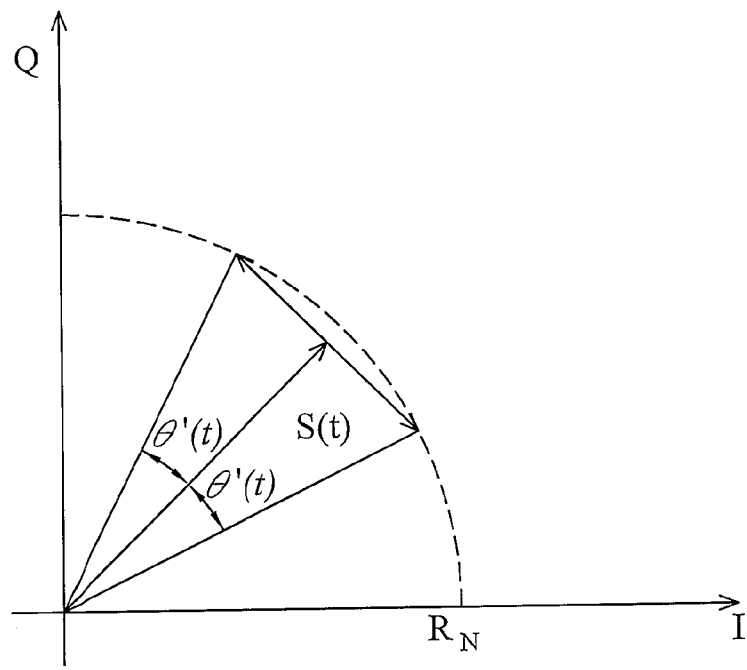
FIGS. 7A to 7C are phasor diagrams, respectively of signal separation and amplification according to an embodiment of the invention.
Figure 7B:
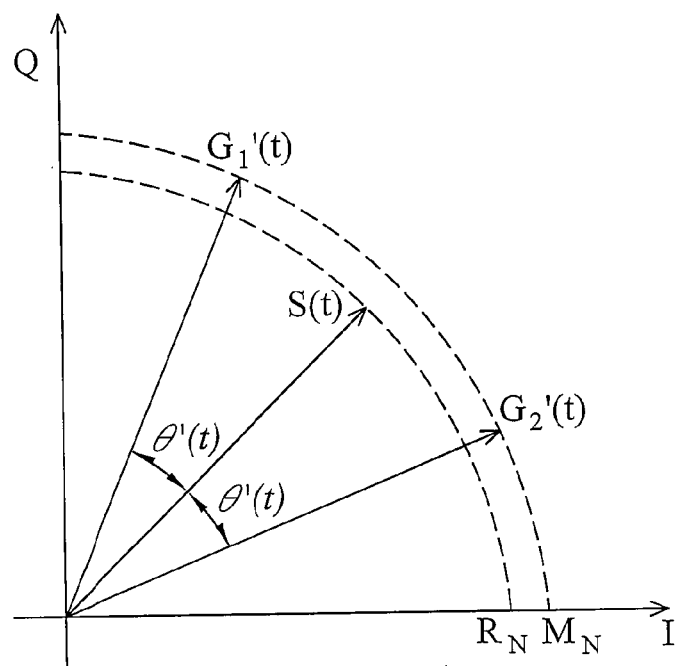

Instead of splitting input signal to magnitude $R_N$, a parameter $M_N$ is used to represent the signal envelope. Referring to FIG. 7A, $R_N$ is used to transform the envelope information of the original signal S(t) into small out-phasing angles θ'(t). Then, $M_N$ is specified as the signal magnitude in FIG. 7B. The new multi-level scheme separates input signal S(t) to two new intermediate frequency signals $S_1'(t)$ and $S_2'(t)$ whose magnitude is $M_N$ instead of $R_N$. The intermediate frequency signals can be expressed as $S_1'(t)=M_N \cdot e^{j \cdot (\Phi(t)+\theta'(t))}$ and $S_2'(t)=M_N \cdot e^{j \cdot (\Phi(t)-\theta'(t))}$. With this new magnitude $M_N$, high PA efficiency is achieved with multilevel scaling scheme.

Figure 7C:
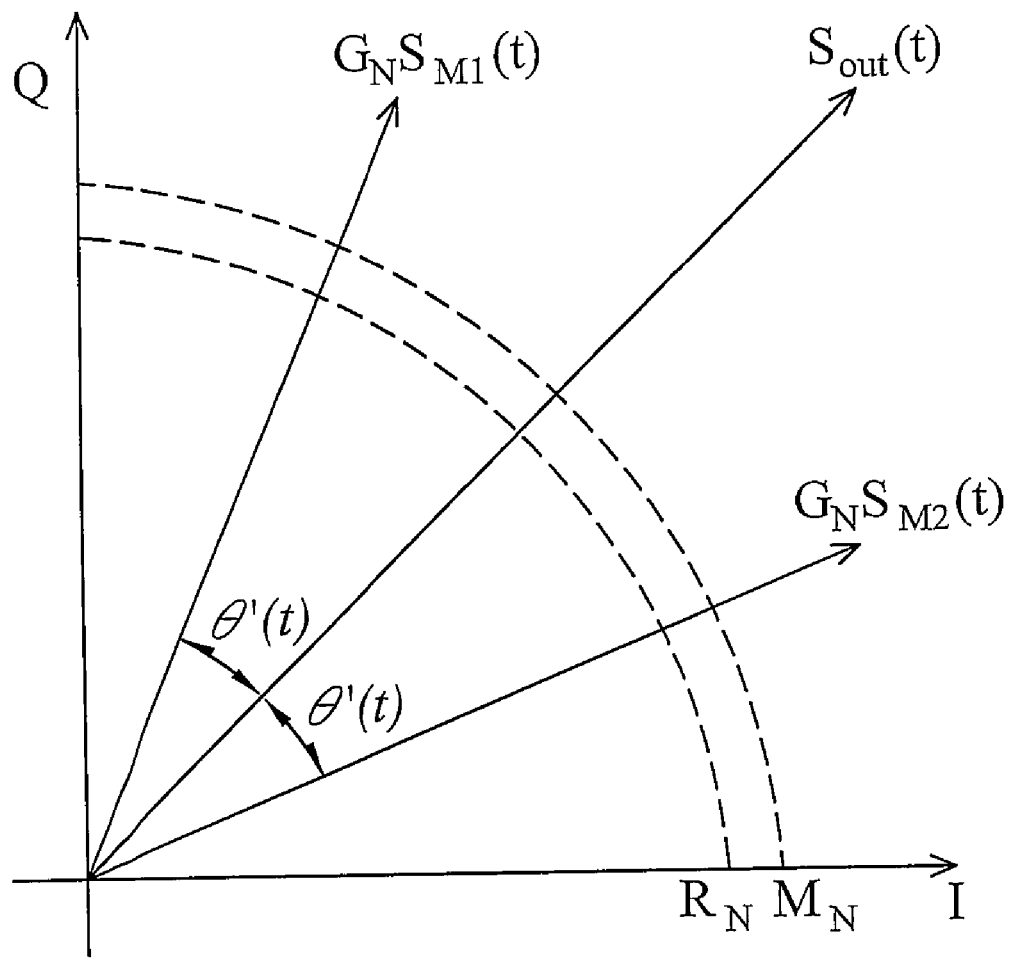

After signal separation, two up-converters are used to up-convert the two complex signals $S_1'(t)$ and $S_2'(t)$ to a radio frequency (RF) band. The up-converted signals can be expressed as $S_{M1}(t)=M_N \cdot \cos(\omega \cdot t+\phi(t)+\theta'(t))$ and $S_{M2}(t)=M_N \cdot \cos(\omega \cdot t+\phi(t)-\theta'(t))$. FIG. 7C illustrates the signals after amplification. The amplified signals are expressed as $G_N \cdot S_{M1}(t)$ and $G_N \cdot S_{M2}(t)$, where $G_N=g_k$, for $R_N=r_k$ $k=0,1, \ldots, N-1$. $G_N$ is the PA gain which corresponds to different input envelope $R_N$. Finally, The combined signal of these two signals in the LINC system output is $$S_{out}(t) = \sqrt{2} \cdot G_N \cdot M_N \cos\theta'(t) \cdot \cos(\varpi t + \varphi(t))$$
$$= \frac{\sqrt{2} \cdot G_N \cdot M_N}{R_N} A(t) \cos(\varpi t + \varphi(t)).$$

Figure 8A:
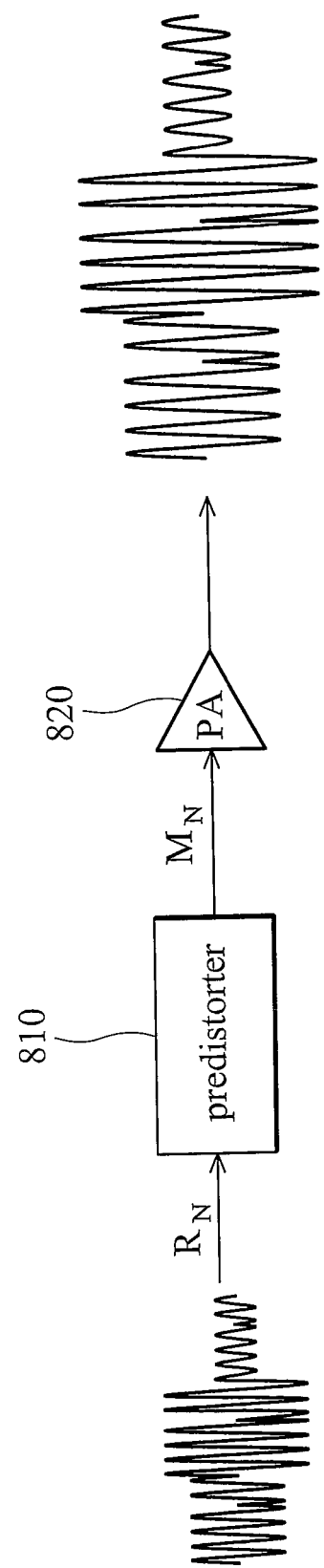
FIGS. 8A to 8D are schematic diagrams, respectively of AM-to-AM predistortion of the predistorter according to an embodiment of the invention.
Figure 8B:
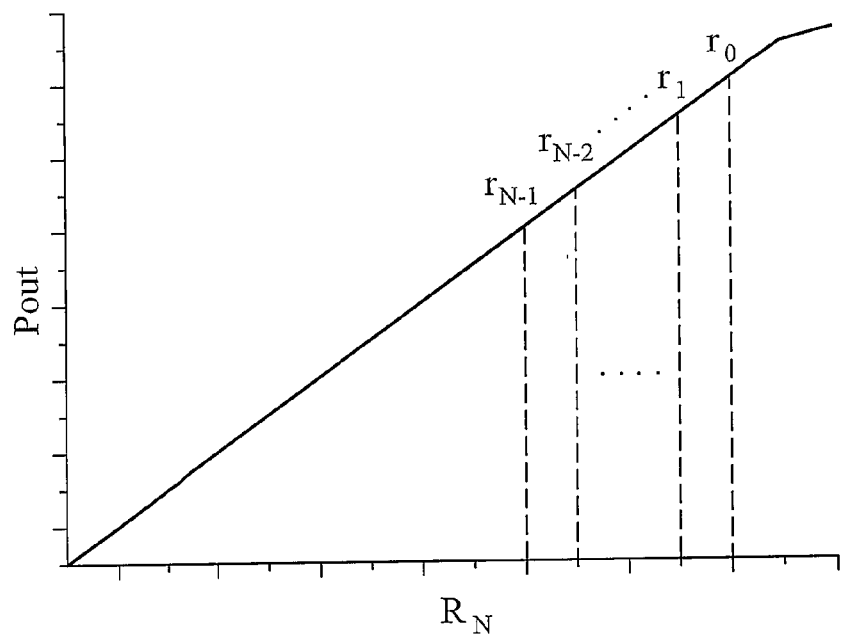
Figure 8C:
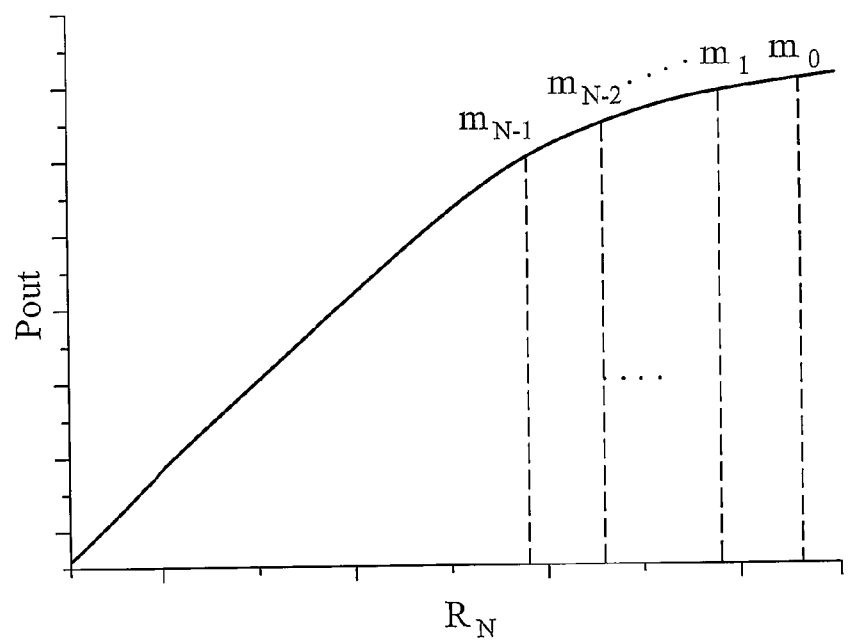
Figure 8D:
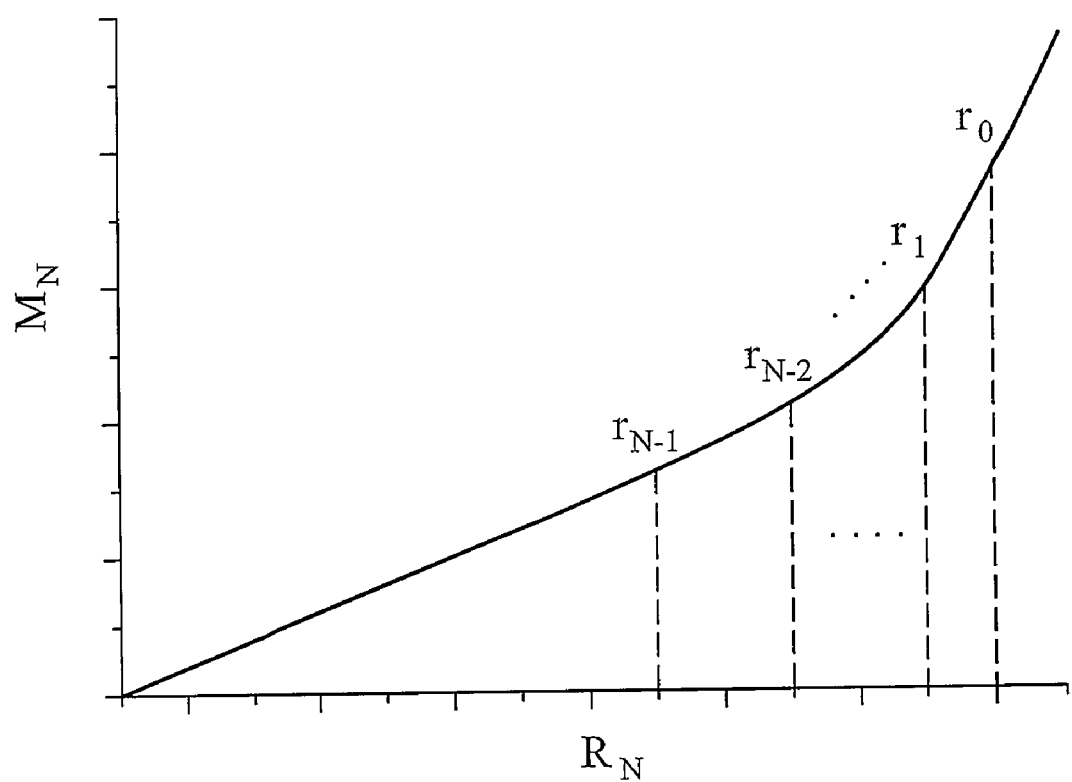

To achieve a linear amplification, the output signal $S_{out}$ should be a constant multiple of $A(t)\cos(\omega t+\phi(t))$. It infers that as long as we can satisfy $$\frac{\sqrt{2} \cdot G_N \cdot M_N}{R_N} = K,$$

high linearity can be achieved. To satisfy the constraint, hardware design as shown in FIG. 8A is exploited. The hardware design comprises a predistorter comprising a predistorter 810 receiving the multilevel envelope $R_N$ and generating the envelope signal $M_N$ and a power amplifier 820 coupled to the predistorter. Then, an output signal of the power amplifier is $G_N \cdot M_N$ and is preferably proportional to the multilevel envelope $R_N$, as shown in FIG. 8B. If the output signal of the power amplifier $G_N \cdot M_N$ is proportional to the multilevel signal $R_N$, then the multilevel LINC transmitter is provided with high linearity. A typical transfer curve of the power amplifier is shown in FIG. 8C. After an actual transfer curve of the power amplifier is extracted, all that is required is to implement a predistorter with a curve mapping as shown in FIG. 8D, which eventually makes the output signal of the power amplifier $G_N \cdot M_N$ proportional to the multilevel signal $R_N$. Referring to FIG. 3, the hardware design can be utilized in the multilevel LINC transmitter according to the embodiment of the invention.

Figure 9:
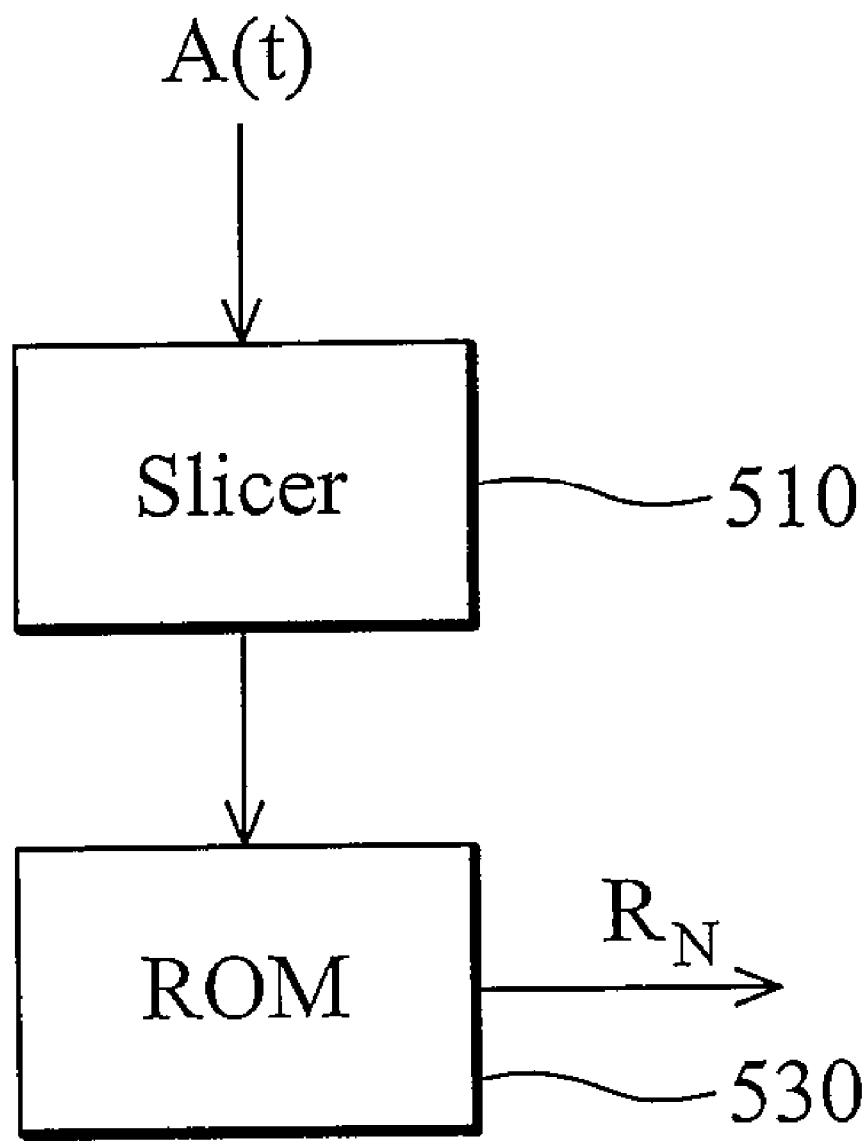
FIG. 9 is a block diagram of a multilevel scaler 313 in FIG. 3.

Referring to FIG. 9, the multilevel scaler 313 comprises a slicer 510 and a ROM 530 coupled to the slicer 510. The slicer 510 is used to select and output a specific $r_k$ to the inverse cosine module 315. Preferably, the slicer 510 comprises a comparator. The comparator determines in which range the envelope A(t) is and which $r_k$ should be selected according thereto. The ROM 530 stores the optimal set of $R_N$ which satisfies the curve mapping in FIG. 8D which eventually makes the output signal of the power amplifier proportional to the multilevel signal $R_N$.

Figure 10:
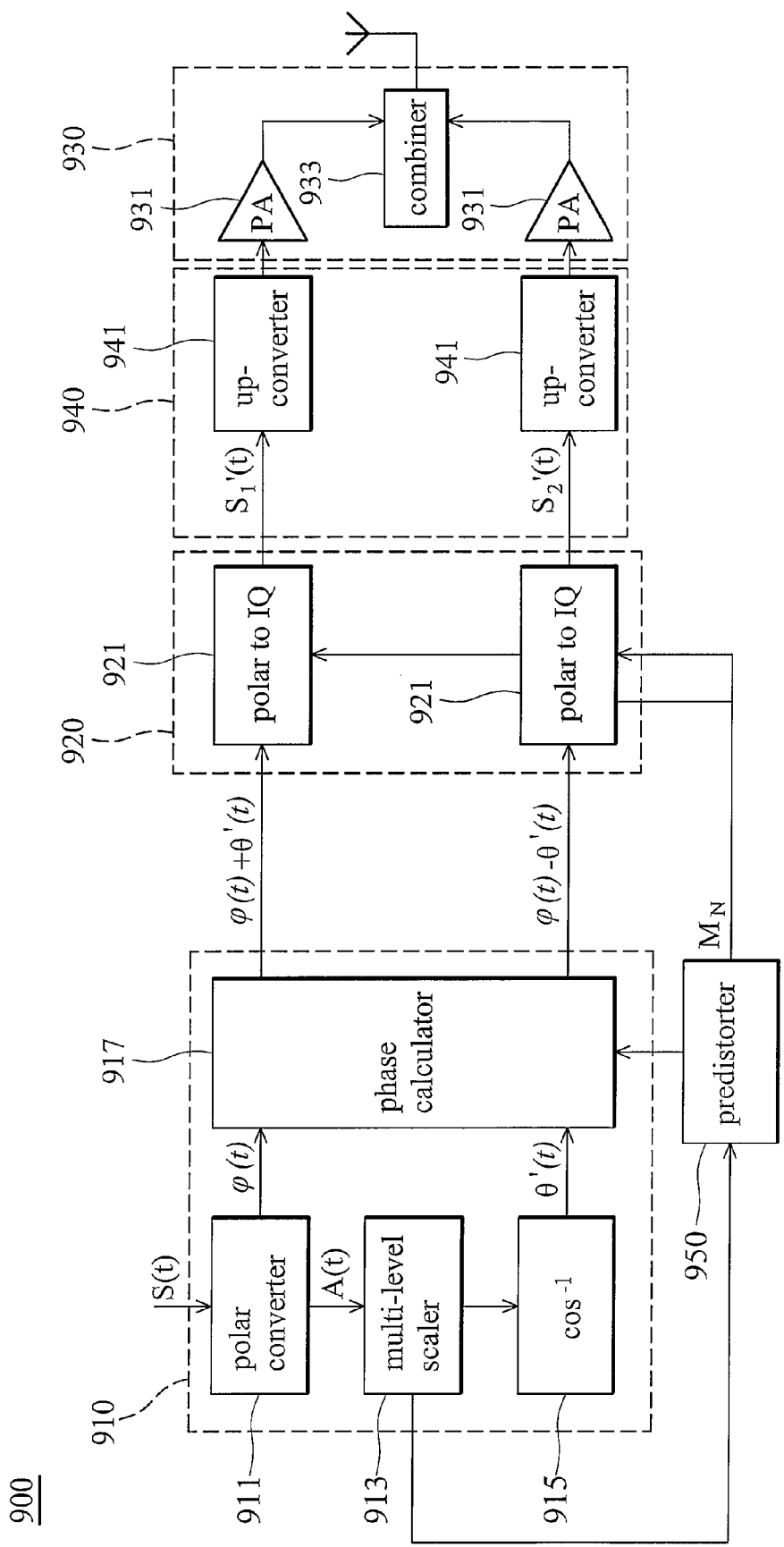
FIG. 10 is a block diagram of a multilevel LINC transmitter according to another embodiment of the invention.

Referring to FIG. 10, another embodiment of the invention, the multilevel LINC transmitter 900 comprises a multilevel signal component separator 910, a predistorter 950, a polar to IQ converter block 920, an up-converter block 940 and an RF block 930. The multilevel signal component separator 910 comprises a polar converter 911, a multilevel scaler 913 coupled to the polar converter 911, an inverse cosine module 915 coupled to the multilevel scaler 913, and a phase calculator 917 coupled to the polar converter 911 and the inverse cosine module 915. The polar converter 911 receives and converts the input signal S(t) to polar form. Then, an envelope signal A(t) is scaled by a multilevel scaler 913 and the inverse cosine module 915 generates an out-phasing angle $\theta'(t)$. Thereafter, the phase calculator 917 generates phase signals $\phi(t)+\theta'(t)$ and $\phi(t)-\theta'(t)$. In other words, the multilevel signal component separator 910 converts the input signal S(t) into phase signals $\phi(t)+\theta'(t)$ and $\phi(t)-\theta'(t)$. The predistorter 950 is coupled to the multilevel scaler 913 and generates an envelope signal $M_N$. The polar to IQ converter block 920 comprises two polar to IQ converters 921. Phase signals $\psi(t)+\theta'(t)$ and $\psi(t)-\theta'(t)$ and the envelope signal $M_N$ are converted to rectangular form by polar to IQ converters 921. The predistorter 950 comprises two up-converters 951 coupled to the corresponding IQ converters 921, respectively. The RF block 930 comprises a plurality power amplifiers 931 coupled to the up-converter block 350 and a power combiner 933 coupled to the power amplifiers 931. Operation principles of the multilevel LINC transmitter in FIG. 10 are similar to those of the multilevel LINC transmitter in FIG. 3 and descriptions thereof are thus skipped.

The invention provides a multilevel LINC transmitter with a multilevel scaler in a multilevel signal component separator thereof. The multilevel scaler dynamically adapts a scale factor according to the input signal and therefore the out-phasing angle is adjustable. As a result, high power efficiency and linearity are achieved.

While the invention has been described by way of example and in terms of preferred embodiment, it is to be understood that the invention is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A multilevel LINC (Linear amplification with Nonlinear Components) transmitter, comprising:
    a multilevel signal component separator comprising a multilevel scaler and converting an input signal to phase signals;
    a phase modulator block coupled to the multilevel signal component separator and receiving the phase signals;
    a predistorter coupled to the multilevel signal component separator and generating an envelope signal;
    a mixer block coupled to the phase modulator block and the predistorter and generating an intermediate frequency signal;
    an up-converter block coupled to the mixer block and up-converting the intermediate frequency signal to a radio frequency (RF) band; and
    an RF block comprising a plurality of power amplifiers coupled to the up-converter block and a power combiner coupled to the plurality of power amplifiers.

2. The multilevel LINC transmitter as claimed in claim 1, wherein the multilevel scaler comprises a slicer and a ROM coupled to the slicer.

3. The multilevel LINC transmitter as claimed in claim 2, wherein the slicer comprises a comparator.

4. The multilevel LINC transmitter as claimed in claim 1, wherein the power combiner is a Wilkinson combiner.

5. The multilevel LINC transmitter as claimed in claim 1, wherein the multilevel signal component separator further comprises a polar converter receiving the input signal and coupled to the multilevel scaler, a inverse cosine module coupled to the multilevel scaler, and a phase calculator coupled to the polar converter and the inverse cosine module and generating the phase signals.

6. The multilevel LINC transmitter as claimed in claim 1, wherein the up-converter block comprises mixers or modulators.

7. A multilevel LINC (Linear amplification with Nonlinear Components) transmitter, comprising:
 a multilevel signal component separator comprising a multilevel scaler and converting an input signal to phase signals;
 a predistorter coupled to the multilevel signal component separator and generating an envelope signal;
 a polar to IQ converter block coupled to the multilevel signal component separator and the predistorter;
 an up-converter block coupled to the polar to IQ converter block; and
 an RF block comprising a plurality of power amplifiers coupled to the up-converter block and a power combiner coupled to the plurality of power amplifiers.

8. The multilevel LINC transmitter as claimed in claim 7, wherein the multilevel scaler comprises a slicer and a ROM coupled to the slicer.

9. The multilevel LINC transmitter as claimed in claim 8, wherein the slicer comprises a comparator.

10. The multilevel LINC transmitter as claimed in claim 7, wherein the power combiner is a Wilkinson combiner.

11. The multilevel LINC transmitter as claimed in claim 7, wherein the multilevel signal component separator further comprises a polar converter receiving the input signal and coupled to the multilevel scaler, a inverse cosine module coupled to the multilevel scaler, and a phase calculator coupled to the polar converter and the inverse cosine module and generating the phase signals.

12. The multilevel LINC transmitter as claimed in claim 7, wherein the up-converter block comprises mixers or modulators.

* * * * *